United States Patent
Jakobson

(10) Patent No.: US 9,261,535 B2
(45) Date of Patent: Feb. 16, 2016

(54) ACTIVE PROBE ADAPTOR

(71) Applicant: SanDisk Technologies Inc., Plano, TX (US)

(72) Inventor: Max Jakobson, Be'er Sheva (IL)

(73) Assignee: SanDisk Technologies, Inc., Plano, TX (US)

( * ) Notice: Subject to any disclaimer, the term of this patent is extended or adjusted under 35 U.S.C. 154(b) by 64 days.

(21) Appl. No.: 13/801,956

(22) Filed: Mar. 13, 2013

(65) Prior Publication Data

US 2014/0273569 A1    Sep. 18, 2014

(51) Int. Cl.
*G01R 1/06* (2006.01)
*G01R 1/067* (2006.01)

(52) U.S. Cl.
CPC ........ *G01R 1/06738* (2013.01); *G01R 1/06766* (2013.01); *G01R 1/06788* (2013.01)

(58) Field of Classification Search
CPC .................................................. G01R 1/06788
USPC .................. 439/169, 219, 482; 324/149, 72.5
See application file for complete search history.

(56) References Cited

U.S. PATENT DOCUMENTS

| | | | | |
|---|---|---|---|---|
| 2,846,658 A * | 8/1958 | Bender | ..................... | 439/891 |
| 3,176,256 A * | 3/1965 | Turinsky | ................ | H01R 11/24 439/169 |
| 3,537,000 A * | 10/1970 | Easi | ............. | 324/72.5 |
| 4,214,804 A * | 7/1980 | Little | ............................ | 439/502 |
| 4,923,407 A * | 5/1990 | Rice et al. | ........................ | 439/92 |
| 4,959,609 A | 9/1990 | Prokopp et al. | | |
| 4,964,807 A * | 10/1990 | Draus | .................... | H01R 11/24 439/169 |
| 5,387,872 A * | 2/1995 | Nightingale | ....... | G01R 1/06788 324/538 |
| 5,424,630 A * | 6/1995 | Vazquez | ............. | G01R 19/155 324/133 |
| 6,191,594 B1 * | 2/2001 | Nightingale et al. | .... | 324/754.08 |
| 6,400,168 B2 * | 6/2002 | Matsunaga et al. | ............. | 29/828 |
| 6,404,215 B1 * | 6/2002 | Nightingale et al. | .... | 324/756.04 |
| 6,466,000 B1 * | 10/2002 | Nightingale | ................. | 324/72.5 |
| 6,603,297 B1 * | 8/2003 | Gessford et al. | ............ | 324/72.5 |
| 6,636,054 B2 * | 10/2003 | Lyford et al. | ................. | 324/715 |
| 6,688,906 B2 * | 2/2004 | Kimbley | ....................... | 439/482 |
| 6,956,362 B1 * | 10/2005 | Campbell et al. | ............ | 324/72.5 |
| 6,967,473 B1 * | 11/2005 | Reed et al. | ..................... | 324/149 |
| 7,025,628 B2 * | 4/2006 | LaMeres et al. | ... | G01R 1/06788 324/754.11 |
| 7,056,134 B2 * | 6/2006 | Martin et al. | ................. | 439/169 |
| 7,221,179 B1 * | 5/2007 | Campbell | ................ | 324/755.05 |

(Continued)

FOREIGN PATENT DOCUMENTS

DE         9005696.5        9/1990

*Primary Examiner* — Neil Abrams
(74) *Attorney, Agent, or Firm* — Jenkins, Wilson, Taylor & Hunt, P.A.

(57) ABSTRACT

An adapter for attaching an active probe to a device under test is disclosed. According to one aspect, an active probe adapter includes an adapter body for connecting an active probe to a device under test (DUT), the adaptor body having an impedance controlled conducting path for connecting a signal of the DUT to a signal input of the active probe, the path including a signal conductor and a reference conductor. The adapter body includes probe-side electrical contacts for electrically connecting an active probe to the signal and reference conductors of the adapter, and a set of DUT-side electrical contacts for electrically connecting the signal and reference conductors of the adapter to the DUT via one or more connectors attached to the contacts. The DUT-side electrical contacts are physically arranged to allow different orientations of the connector relative to the adapter body.

14 Claims, 7 Drawing Sheets

(56) References Cited

U.S. PATENT DOCUMENTS

| | | | |
|---|---|---|---|
| 7,332,923 B2 * | 2/2008 | Schott et al. | 324/754.06 |
| 7,902,848 B2 * | 3/2011 | Eccleston et al. | 324/754.03 |
| 7,948,250 B2 * | 5/2011 | Peschke | 324/724 |
| 8,098,078 B1 * | 1/2012 | Campbell | 324/754.11 |
| 9,069,011 B2 * | 6/2015 | Walcher | G01R 1/06705 |
| 2009/0284268 A1 | 11/2009 | Burt et al. | |
| 2011/0291664 A1 | 12/2011 | Hall | |
| 2014/0273569 A1 * | 9/2014 | Jakobson | 439/169 |

* cited by examiner

--Prior Art--

--Prior Art--

ACTIVE PROBE ADAPTOR

TECHNICAL FIELD

The subject matter described herein relates to methods and systems for attaching an active probe to a device under test. More particularly, the subject matter described herein relates to an active probe adapter.

BACKGROUND

An active probe is a device for connecting a measurement tool, such as an oscilloscope, data analyzer, voltmeter, ammeter, etc., to a device under test (DUT), which may be an electrical component, printed circuit board (PCB), and the like. Active probes are designed to minimize the effect that the presence of the measuring tool has on the system being measured, and typically include sensors and buffers. For example, an active probe for measuring voltage may have a high impedance sensor coupled with an active circuit such as an operational amplifier, or op-amp, to amplify the sensed voltage to levels that may be read by the measurement tool. Reactive and resonant circuits, for example, may be monitored using an active probe in situations where the mere presence of a normal probe would change the resonant frequency of the reactive circuit because the normal probe itself has a non-trivial resistance, capacitance, inductance, and/or impedance. Thus, unlike a passive probe, which may be just a simple conductor, active probes tend to be large relative to the DUT or components of the DUT—so large and unwieldy that it becomes difficult to connect the active probe to smaller and smaller devices that are packed at higher and higher densities on a PCB.

There are disadvantages associated with conventional methods for attaching an active probe to a DUT, shown in FIGS. 1A through 1D.

FIG. 1A illustrates a conventional approach to attaching an active probe 100 to a signal trace of interest 102 on the surface of a printed circuit board PCB 104 of a device under test via an adapter 106 that must be soldered to PCB 104. This approach provides good performance but requires not only foreknowledge of what signal traces will need to be monitored but also a not-insignificant amount of space on PCB 104 for one or more adapters. As the density of elements on PCBs increases, this approach becomes prohibitive in terms of space and cost. This approach has the additional disadvantage that adapter 106 forces active probe 100 into an orientation that is normal to the surface of PCB 104, which could be a problem when probing multiple cards in a cage, for example, where the distance between boards may be too small to accommodate an active probe in that orientation.

FIG. 1B illustrates another conventional approach to attaching active probe 100 to PCB 104, i.e., by providing a series of test points 108 on the surface of PCB 104, which the user can probe by holding active probe 100 so that the probe pin 110 contacts the signal of interest while a ground blade 112 contacts a ground plane or reference signal. While this approach takes up less space than the approach shown in FIG. 1A, the approach shown in FIG. 1B has the disadvantage that the user must hold the probe in place manually or by using articulated clamping devices, for example. If multiple probes must be held in place, multiple users or claims must be present to hold the probes in place, which quickly becomes unwieldy.

FIGS. 1C and 1D illustrate other conventional approaches to attaching active probe 100 to PCB 104 by using a flexible signal lead 114 connected to the signal input pin of active probe 100. In FIG. 1C, lead 114 is fitted with a clamp, hook, or other device 116 for attaching the end of the lead to an available pin 118 of a device on PCB 104. The reference input (e.g., the ground pin) of active probe 100 is attached to a ground or reference pin 120 that is soldered onto PCB 104. In FIG. 1D, lead 114 includes a socket that fits over a test point 122 that is provided on PCB 104. In FIGS. 1C and 1D, while better than the approaches shown in FIGS. 1A and 1B, the conventional approaches shown in FIGS. 1C and 1D have the disadvantage that the flexible signal lead 114, which is not shielded, reduces the performance of active probe 100 due to injection of noise or reduction of bandwidth caused by the resistance, capacitance, or impedance of lead 114, which increase as the length of lead 114 increases. In addition, the distance between the far end of lead 114 and reference pin 120 can cause ringing of the measured signal or the creation of a ground loop.

Accordingly, there exists a need for an active probe adapter that overcomes the disadvantages associated with conventional approaches to attaching an active probe to a device under test.

SUMMARY

According to one aspect, an active probe adapter includes an adapter body for connecting an active probe to a device under test (DUT), the adaptor body having an impedance controlled conducting path for connecting a signal of the DUT to a signal input of the active probe, the path including a signal conductor and a reference conductor. The adapter body includes a first probe-side electrical contact for electrically connecting the signal conductor to the signal input of the active probe, a second probe-side electrical contact for electrically connecting the reference conductor to a reference input of the active probe, and a plurality of DUT-side electrical contacts for electrically connecting the signal conductor and the reference conductor to the DUT. The active probe adapter also includes a connector for selectively connecting a first of the DUT-side electrical contacts to a node associated with a signal of interest of the DUT and a second of the DUT-side electrical contacts to a reference node of the DUT, where the DUT-side electrical contacts are physically arranged to allow different orientations of the connector relative to the adapter body.

BRIEF DESCRIPTION OF THE DRAWINGS

Preferred embodiments of the subject matter described herein will now be explained with reference to the accompanying drawings, wherein like reference numerals represent like parts, of which.

DETAILED DESCRIPTION

In accordance with the subject matter disclosed herein, an active probe adapter is provided. Reference will now be made in detail to exemplary embodiments of the present invention, examples of which are illustrated in the accompanying drawings. Wherever possible, the same reference numbers will be used throughout the drawings to refer to the same or like parts.

Figure 1A:
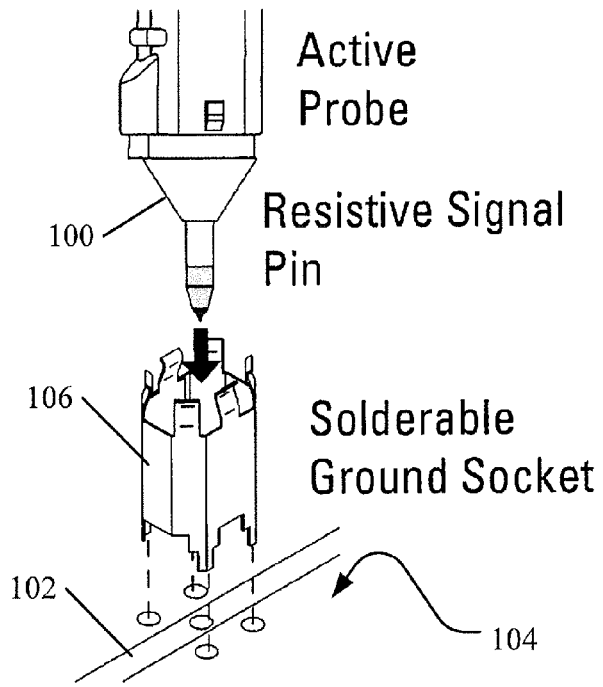
FIGS. 1A through 1D illustrate conventional approaches to attaching an active probe to a device under test.
Figure 1B:
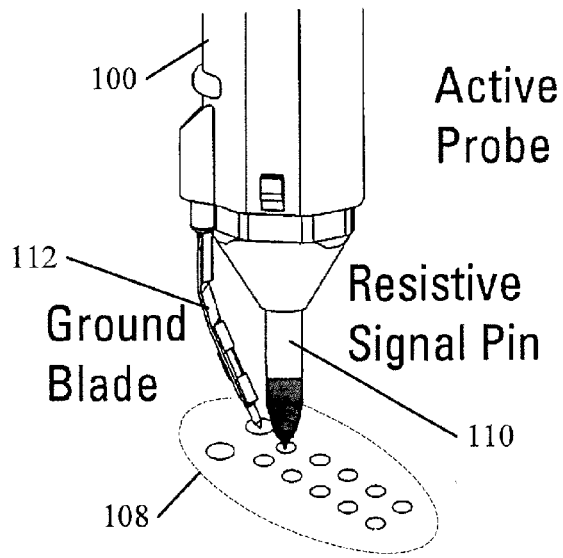
Figure 1C:
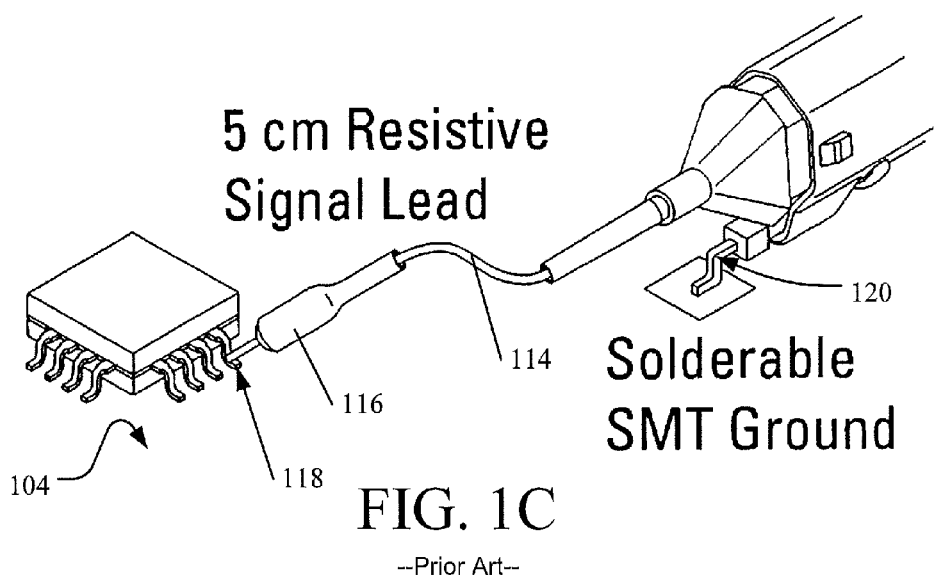
Figure 1D:
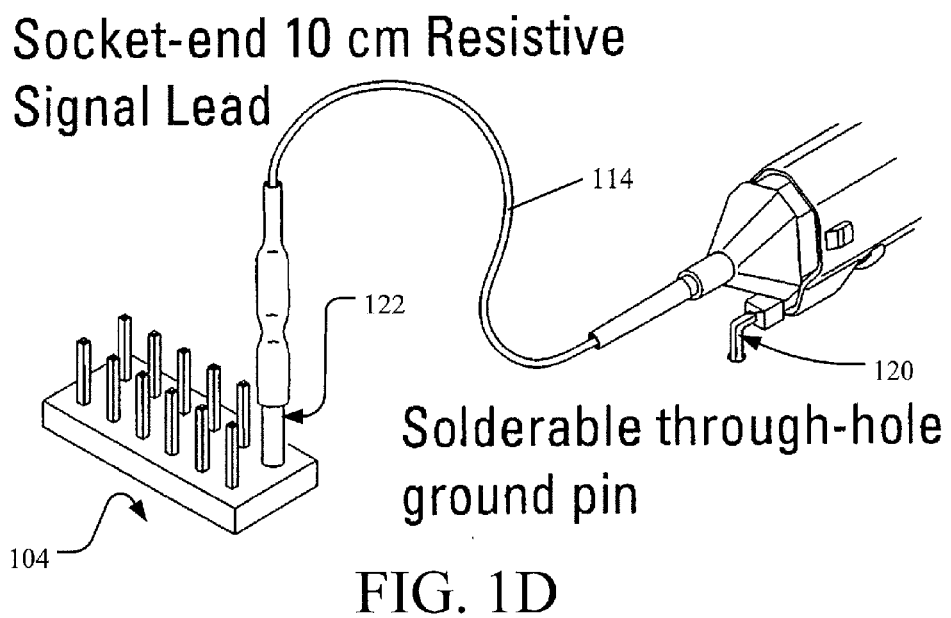
Figure 2:
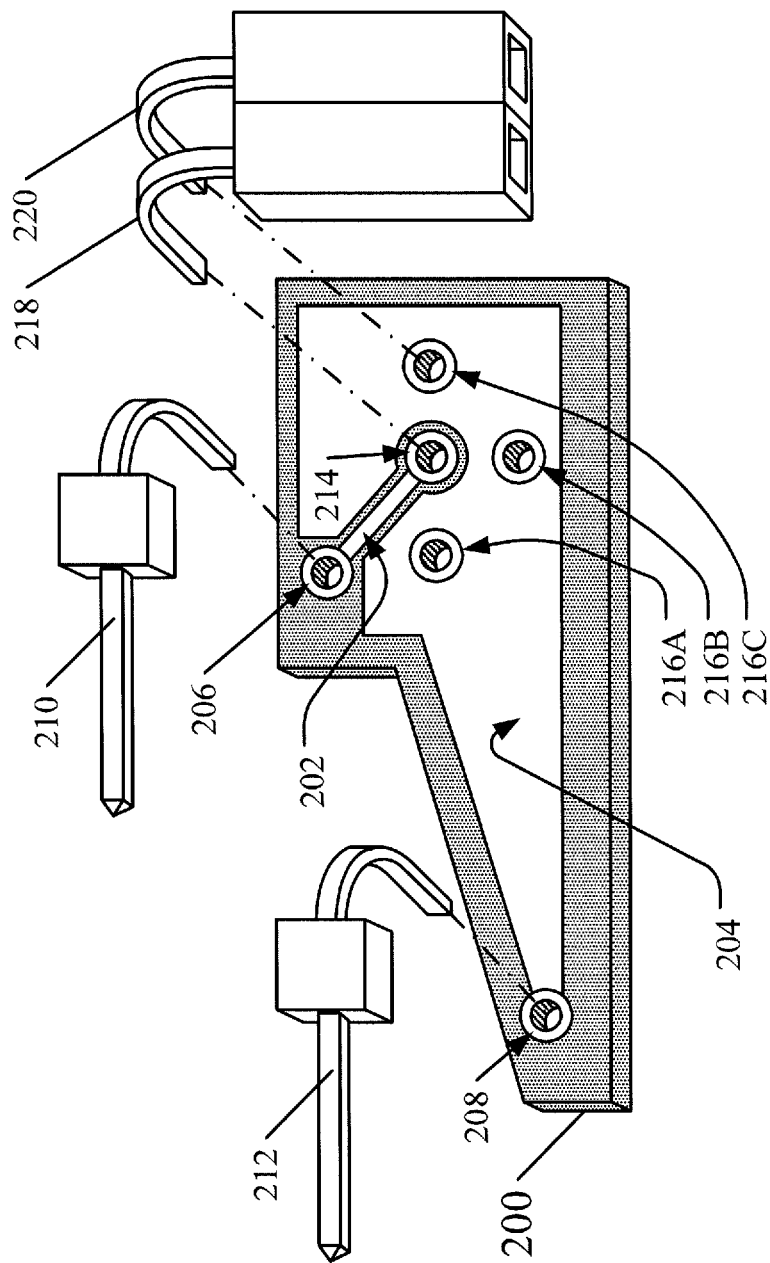
FIG. 2 is a view of an exemplary active probe adapter according an embodiment of the subject matter described herein.

FIG. 2 is a view of an exemplary active probe adapter 200 according an embodiment of the subject matter described herein. In the embodiment illustrated in FIG. 2, adapter 200 includes and impedance controlled conducting path for connecting a signal of a device under test (DUT) to a signal input of an active probe, the path including a signal conductor 202 and a reference conductor 204. In one embodiment, the body of adapter 200 may be a printed circuit board, and signal conductor 202 may be a stripline within the PCB or a microstripline structure on the surface of the PCB. In the embodiment illustrated in FIG. 2, signal conductor 202 and reference conductor 204 are on the same layer of the body of adapter 200, but in alternative embodiments, the body of adapter 200 may be a multi-layer PCB, in which case signal conductor 202 may be on a different layer than reference conductor 204. Alternatively, signal conductor 202 may be a segment of coaxial cable or other shielded conductor, where the outer shield is reference conductor 204. In one embodiment, signal conductor 202 and/or reference conductor 204 may be a conductive plane.

Adapter 200 also includes a first probe-side electrical contact 206 for connecting signal conductor 202 to a signal input of an active probe, and a second probe-side electrical contact 208 electrically connecting reference conductor 204 to a reference input of the active probe. In one embodiment, an active probe is connected to adapter 200 by means of connectors that are attached to contacts 206 and 208 respectively. In the embodiment illustrated in FIG. 2, for example, electrical contacts 206 and 208 are through-holes to which header pins 210 and 212 may be soldered.

Adapter 200 also includes a set of DUT-side electrical contacts for electrically connecting signal conductor 202 and reference conductor 204 to the DUT. In the embodiment illustrated in FIG. 2, signal conductor 202 includes a DUT-side electrical contact 214 and reference conductor 204 includes a set of DUT-side electrical contacts 216A, 216B, and 216C.

Adapter 200 also includes at least one connector for selectively connecting a first of the DUT-side electrical contacts to a node associated with a signal of interest of the DUT and a second of the DUT-side electrical contacts to a reference node of the DUT, where the DUT-side electrical contacts are physically arranged to allow different orientations of the connector relative to the adapter body. In the embodiment illustrated in FIG. 2, for example, connector 218 connects electrical contact 214 to a signal of interest on the DUT and connector 220 connects electrical connector 216C to a reference node on the DUT. In this configuration, connectors 218 and 220 form a pair of connectors for signal and ground, respectively, in close proximity to each other.

The set of electrical contacts 216A-C, herein collectively referred to as electrical contacts 216, are located in various positions on adapter body 200. In the embodiment illustrated in FIG. 2, for example, connector 218 may be attached to contact 214 and connector 220 may be attached to contact 216C. In this configuration, connector 218 connects the signal of interest on the DUT to a signal input of the active probe, while connector 220 connects a reference node on the DUT to a reference input of the active probe. As will be described below, the set of contacts 214 and 216 allow adapter 200 to be configured with connectors that have various orientations relative to the body of adapter 200 as well as various orientations relative to the body of the active probe to which adapter 200 is attached.

Figure 3:
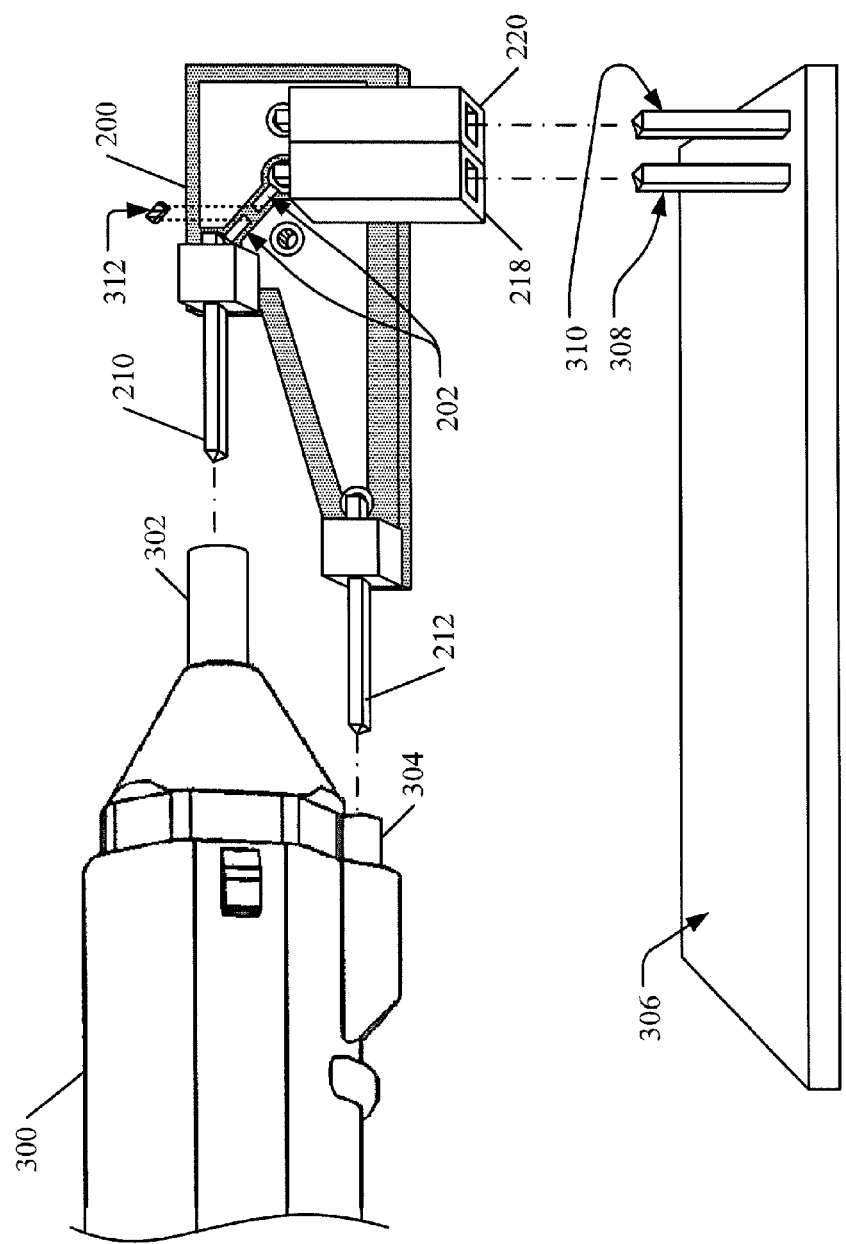
FIG. 3 illustrates an example use of an exemplary active probe adapter according to an embodiment of the subject matter described herein.

FIG. 3 illustrates an example use of an exemplary adapter according to an embodiment of the subject matter described herein. In the embodiment illustrated in FIG. 3, connector 210 of adapter 200 connects to the signal input 302 of active probe 300, and connector 212 of adapter 200 connects to the reference input 304 of active probe 300. Adapter 200 allows the user to connect active probe 300 securely to a device under test, DUT 306. A popular implementation of a test point on the PCB board is through-hole or surface-mount male header. A pair of header pins, e.g., one for signal and the other for ground, make an ideal on-board connection. In the embodiment illustrated in FIG. 3, DUT 306 includes two header pins, 308 and 310 which provide access to a signal of interest and a reference signal or ground plane, respectively. During use, connectors 218 and 220 of adapter 200 will slide over or otherwise electrically connect to header pins 308 and 310, respectively, of DUT 306.

In the embodiment illustrated in FIG. 3, signal conductor 202 includes an element 312 in series, such as a resistor, capacitor, or other element. Element 312 may provide impedance matching, may provide high-pass filtering or DC isolation, etc. Alternatively, there may be parasitic or actual elements between signal conductor 202 and reference conductor 204.

In the embodiment illustrated in FIGS. 2 and 3, connectors 218 and 220 are oriented such that the length of the connector body is parallel to the plane of the body of adapter 200 and pointing toward the bottom of FIG. 2. However, by using contact 214 in combination with other contacts from the set of electrical contacts 218, connector pair may be mounted in a variety of orientations relative to the body of adapter 200. Examples of other possible orientations will now be shown.

Figure 4A:
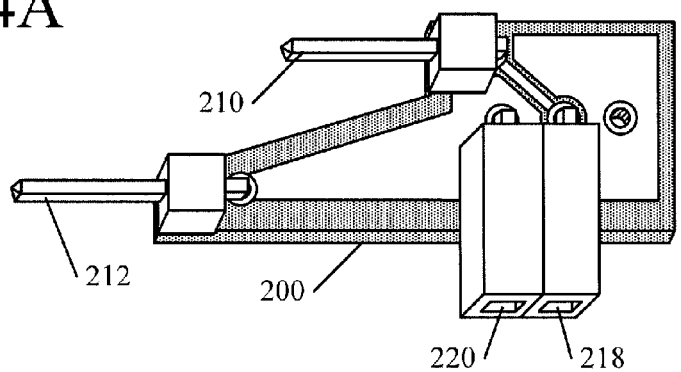
FIGS. 4A through 4F illustrate embodiments of an exemplary active probe adapter showing connectors having various orientations relative to the adapter body and/or the body of the active probe.
Figure 4B:
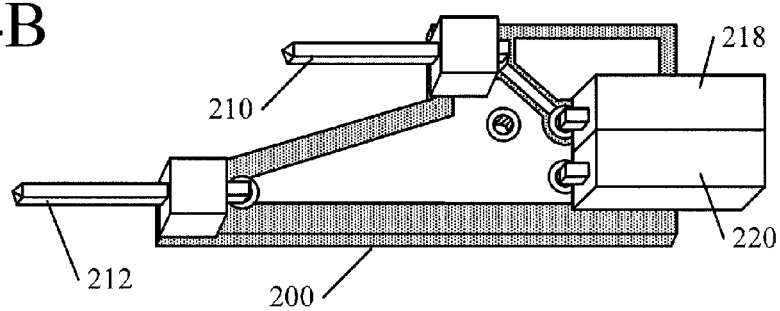
Figure 4C:
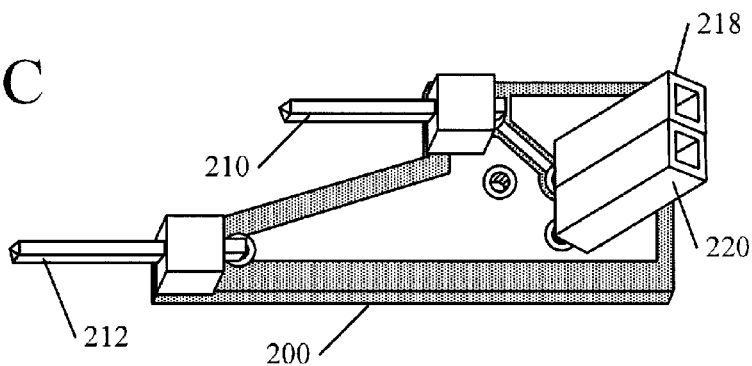
Figure 4D:
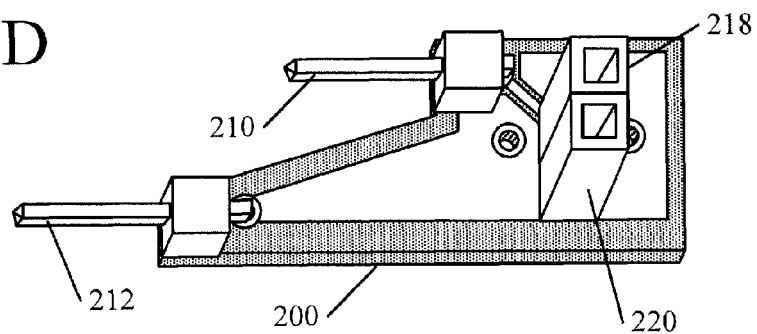
Figure 4E:
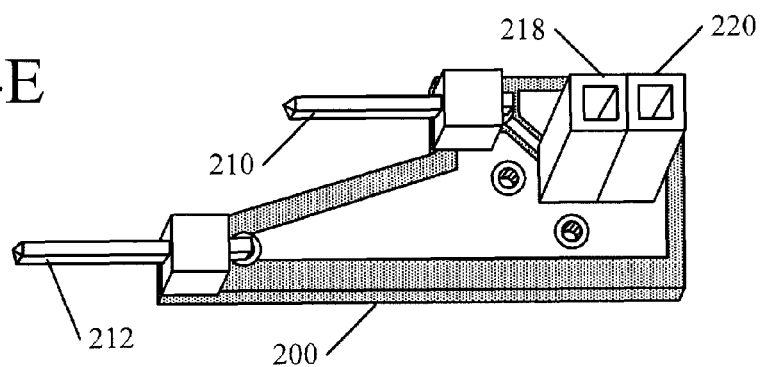
Figure 4F:
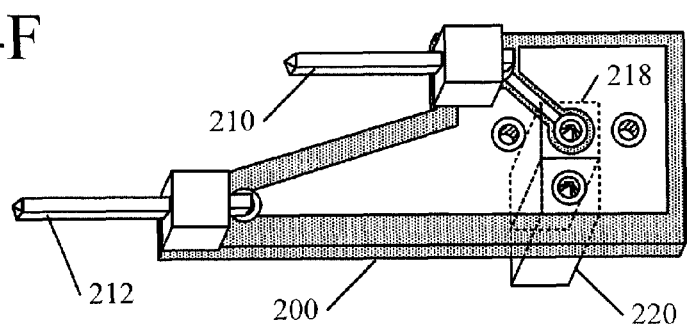

FIGS. 4A through 4F illustrate the feature that adapter 200 can be configured such that the pair of connectors 216 and 220 can have several orientations relative to the adapter body. In FIG. 4A, for example, signal connector 218 is to the right of reference connector 220, in contrast to the configuration in FIG. 2, where signal connector 218 is to the left of reference connector 220. In FIG. 4B, connectors 218 and 220 are oriented to the right, in contrast to the configuration in FIG. 4A, in which the connectors are oriented down. In FIG. 4C, the bodies of connectors 218 and 220 are not oriented parallel to the body of adapter 200, but are instead angled away from the body of adapter 200, e.g., at a 45 degree angle from the plane of the body of adapter 200, although other angles are contemplated. In FIG. 4D, connectors 218 and 220 are at an orientation normal to the plane of the body of adapter 200, with signal connector 218 above reference connector 220. In FIG. 4E, connectors 218 and 220 are again oriented normal to the plane of the body of adapter 200, but with signal connector 218 to the left of reference connector 220 in the figure. FIG. 4F illustrates another embodiment in which the connectors are attached to the adapter body but are oriented away from the viewer, and are thus partially obscured by the adapter body.

Figure 5:
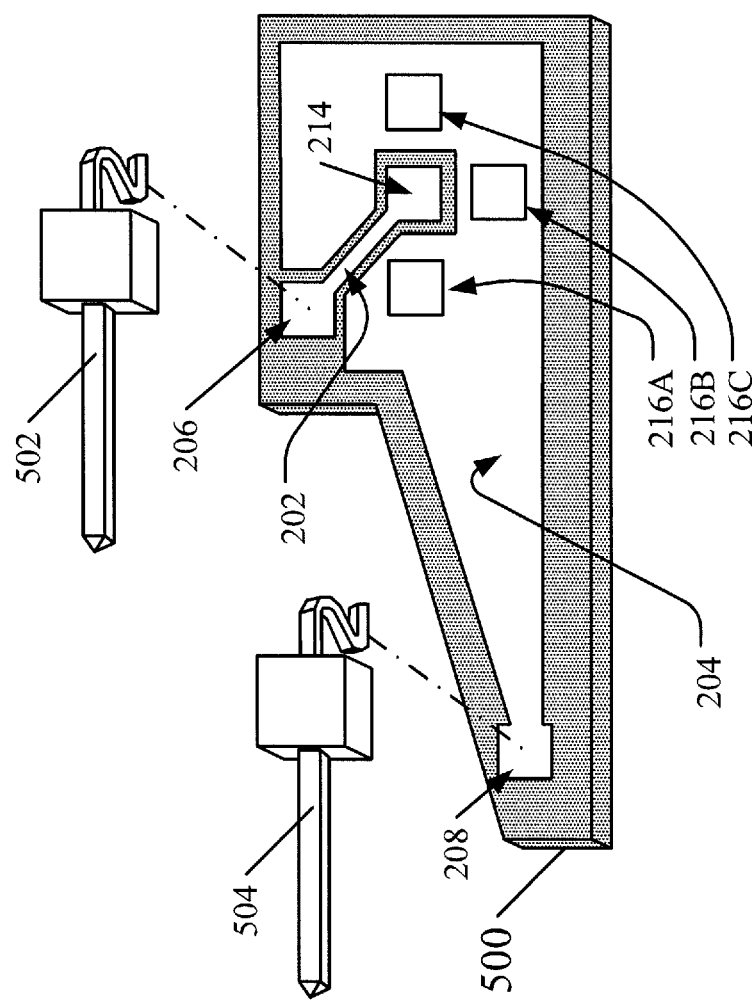
FIG. 5 is a view of an exemplary active probe adapter according to yet another embodiment of the subject matter described herein.

FIG. 5 is a view of an exemplary active probe adapter according to yet another embodiment of the subject matter described herein. In the embodiment illustrated in FIG. 5, adapter body 500 is essentially identical to adapter body 200 illustrated in FIG. 2, except that electrical contacts 206, 208, 214, 216A, 216B, and 216C are not through holes as shown in FIG. 2 but are instead pads suitable for the connection of surface mount technology (SMT) devices, such as SMT contacts 502 and 504. Other types of electrical contacts may be used instead of, or in combination with, through holes and SMT contacts.

The embodiments illustrated in FIGS. 2 through 5 are exemplary and are for the purpose of illustration and are not intending to be limiting. For example, the shape, size of adapter body 200 as well as the position and orientations of probe-side electrical contacts 206 and 208 may vary as appropriate to fit an active probe having a different shape from active probe 300 shown in FIG. 3. Likewise, one double connector may be used in place of the two single connectors 218 and 220 shown in FIG. 2, for example. In the same manner, the number and relative locations of DUT-side electrical contacts may vary from the particular locations shown in the embodiments illustrated in FIGS. 2 through 5. In one embodiment, for example, the DUT-side contacts may be arranged in a row or array having a pitch suitable for standard through hole or SMT connectors. Example pitches include 50 mil and 100 mil, but other pitches may be used.

The advantages of active probe adapter embodiments as described herein are that the adapter allows the connection of an active probe in a proper way to almost every place on the board, even where there is little clearance above the surface of the board, without requiring the probe to be held in place. In addition, the active probe adapter is very simple, easy and intuitive to use, easy to implement, and low cost. The active adapter according to the subject matter described herein provides a way for hardware board designers to place an active probe in almost every desired location on a PCB, without the need for a bulky and expensive test adapter, without requiring the user to hold the active probe in place or requiring the active probe to be oriented normal to the surface of the PCB, without long leads, and in manner that keeps the signal and reference/ground pins in close proximity.

It will be understood that various details of the subject matter described herein may be changed without departing from the scope of the subject matter described herein. Furthermore, the foregoing description is for the purpose of illustration only, and not for the purpose of limitation.

What is claimed is:

1. An active probe adapter, the adapter comprising:
    an adapter body for connecting an active probe to a device under test (DUT), the adaptor body including:
        an impedance controlled conducting path for connecting a signal of the DUT to a signal input of the active probe, the path including a signal conductor and a reference conductor;
        a first probe-side electrical contact for electrically connecting the signal conductor to the signal input of the active probe;
        a second probe-side electrical contact for electrically connecting the reference conductor to a reference input of the active probe; and
        a plurality of DUT-side electrical contacts for electrically connecting the signal conductor and the reference conductor to the DUT; and
    a connector for selectively connecting a first of the DUT-side electrical contacts to a node associated with a signal of interest of the DUT and a second of the DUT-side electrical contacts to a reference node of the DUT,
    wherein the DUT-side electrical contacts are physically arranged to receive the connector from the DUT in different orientations relative to the adapter body;
    wherein the adapter body comprises a printed circuit board that is substantially planar and is a device that is distinct and separate from each of the active probe and the DUT.

2. The active probe adapter of claim 1 wherein the orientations relative to the adapter body include orientations parallel to a plane of the adapter body, orientations normal to a plane of the adapter body, and orientations at an angle between parallel to a plane of the adapter body and normal to a plane of the adapter body, and wherein the orientations parallel to the plane of the adapter body include orientations parallel to an axis of the body of the active probe, orientations perpendicular to the axis of the body of the active probe, and orientations at an angle between parallel to an axis of the body of the active probe and perpendicular to the axis of the body of the active probe.

3. The active probe adapter of claim 1 wherein the signal conductor includes at least one of a resistive element, a capacitive element, and an inductive element in series with the signal conductor.

4. The active probe adapter of claim 1 wherein the impedance controlled conduction path includes at least one of a resistive element, a capacitive element, and an inductive element between the signal conductor and the reference conductor.

5. The active probe adapter of claim 1 wherein the reference conductor comprises a reference plane.

6. The active probe adapter of claim 1 wherein the impedance controlled conduction path comprises a stripline or microstripline.

7. The active probe adapter of claim 1 wherein the impedance controlled conducting path includes a coaxial cable having a center conductor surrounded by a conductive shield, wherein the center conductor comprises the signal conductor and the shield comprises the reference conductor.

8. The active probe adapter of claim 1 wherein the impedance controlled conduction path comprises a pair of conductive paths on the same layer of the printed circuit board or on different layers of the printed circuit board.

9. The active probe adapter of claim 1 wherein at least one of the electrical contacts comprises a through hole.

10. The active probe adapter of claim 9 wherein the through hole accommodates a header pin.

11. The active probe adapter of claim 1 wherein at least one of the electrical contacts is configured to accept a surface mount technology (SMT) connector.

12. The active probe adapter of claim 1 wherein the contacts are configured to accept a multi-conductor header structure.

13. The active probe adapter of claim 1 wherein a plurality of DUT-side contacts are arranged in a regular pattern having a pitch.

14. The active probe adapter of claim 13 wherein the pitch is 50 mils or 100 mils.

* * * * *